(12) United States Patent
Schaber et al.

(10) Patent No.: US 12,008,234 B2
(45) Date of Patent: Jun. 11, 2024

(54) MANAGING MEMORY IN AN ELECTRONIC SYSTEM

(71) Applicant: Teradyne, Inc., North Reading, MA (US)

(72) Inventors: Scott D. Schaber, North Reading, MA (US); Howard Lin, North Reading, MA (US)

(73) Assignee: TERADYNE, INC., North Reading, MA (US)

(*) Notice: Subject to any disclaimer, the term of this patent is extended or adjusted under 35 U.S.C. 154(b) by 45 days.

(21) Appl. No.: 17/523,175

(22) Filed: Nov. 10, 2021

(65) Prior Publication Data

US 2023/0146534 A1 May 11, 2023

(51) Int. Cl.
*G06F 3/06* (2006.01)
*G06F 11/263* (2006.01)
*G06F 12/06* (2006.01)

(52) U.S. Cl.
CPC .......... *G06F 3/0604* (2013.01); *G06F 3/0655* (2013.01); *G06F 3/0679* (2013.01); *G06F 11/2635* (2013.01); *G06F 12/0638* (2013.01)

(58) Field of Classification Search
CPC .................. G06F 11/2635; G06F 12/0638
USPC ......................................................... 714/32
See application file for complete search history.

(56) References Cited

U.S. PATENT DOCUMENTS

| | | | |
|---|---|---|---|
| 9,116,785 B2 | 8/2015 | Ferry | |
| 2003/0084388 A1* | 5/2003 | Williamson, Jr. | ............................ G01R 31/31921 714/725 |
| 2004/0177302 A1 | 9/2004 | Mori et al. | |
| 2005/0022065 A1* | 1/2005 | Dixon | .................. G11C 29/848 714/42 |
| 2007/0294581 A1* | 12/2007 | Dean | ....................... G06F 30/20 714/33 |
| 2008/0229162 A1 | 9/2008 | Hata et al. | |
| 2012/0198292 A1 | 8/2012 | Yuzurihara et al. | |
| 2014/0281776 A1 | 9/2014 | Champion et al. | |

OTHER PUBLICATIONS

Wikipedia "Memory hierarchy" page, retrieved from https://en.wikipedia.org/wiki/Memory_hierarchy (Year: 2023).*
Written Opinion for International Patent Application No. PCT/US2022/048948, dated Mar. 2, 2023, (4 pages).
International Search Report for International Patent Application No. PCT/US2022/048948, dated Mar. 2, 2023, (3 pages).
International Search Report and Written Opinion in Application No. PCT/US2022/048948 dated Mar. 2, 2023 (9 pages).

* cited by examiner

*Primary Examiner* — Yair Leibovich
(74) *Attorney, Agent, or Firm* — Burns & Levinson LLP (57) ABSTRACT

An example system includes first memory, second memory having a greater areal density than the first memory, and a logic circuit configured to move some test data from the second memory to the first memory while at least one of (i) reading other test data from the first memory or (ii) processing the other test data. The logic circuit is configured to process the other test data prior to output along a test channel. The test channel leads to a device under test (DUT) to be tested.

26 Claims, 5 Drawing Sheets

MANAGING MEMORY IN AN ELECTRONIC SYSTEM

TECHNICAL FIELD

This specification describes examples of techniques for managing memory in an electronic system, such as a test system.

BACKGROUND

Test systems are configured to test the operation of electronic devices referred to as devices under test (DUTs). A test system may include test instruments to send signals, including digital signals, to a DUT for testing. A test instrument may include a channel card, such as a digital channel card, to output test signals for testing the DUT and to receive response signals that are based on the test signals.

SUMMARY

An example system includes first memory, second memory having a greater areal density than the first memory, and a logic circuit configured to move some test data from the second memory to the first memory while at least one of (i) reading other test data from the first memory or (ii) processing the other test data. The logic circuit is configured to process the other test data prior to output along a test channel. The test channel leads to a device under test (DUT) to be tested. The example system may include one or more of the following features, either alone or in combination.

The first memory may include a first memory module and a second memory module. Moving test data from the second memory to the first memory may include reading some test data from the second memory and storing the read test data in the first memory module while reading other test data from the second memory module. Moving test data from the second memory to the first memory may include reading some test data from the second memory and storing the read test data in the first memory module while the other test data is being processed. The processing may include setting timing for the other test data and performing at least one of branching, looping, or jumping operations in a script operating on the other test data.

The system may be or include a test system. The test system may include pin electronics along the test channel. The pin electronics may be configured to receive the other tests data following processing by the logic circuit and to output testing data to the DUT that is based on the other test data.

The first memory may include a first double data rate dynamic random access memory (DDR RAM) and a second DDR RAM. The second memory may include stacked flash memory. The second memory may include network storage. The first memory may store expect data. The expect data may represent expected DUT test results. The logic circuit may be configured to receive test result data associated with the DUT, to read the expect data from the first memory, to compare the test result data to the expect data to identify whether the DUT has passed or failed testing, and to store in memory information for the DUT based on the comparing. The information may be stored in a log in the first memory. The operations further may include moving at least part of the log from the first memory to the second memory.

An example system includes first memory, second memory having a greater areal density than the first memory, and a logic circuit configured to perform operations that include reading first data from the second memory, storing the first data in the first memory, reading the first data from the first memory, and processing the first data prior to output to a test channel. The test channel leads to a device under test (DUT) to be tested. While the first data is being read from the first memory or being processed, the system is also configured to perform operations that include reading second data from the second memory and storing the second data in available first memory, The first data and the second data may include test data. The example system may include one or more of the following features, either alone or in combination.

The first memory may include a first memory module and a second memory module. Storing the first data in the first memory may include storing the first data in the first memory module. Reading the first data from the first memory may include reading the first data from the first memory module. Storing the second data in available first memory may include storing the second data in the second memory module. The second memory module may include the available first memory.

The operations may include: after all or part of the first data has been read from the first memory module, reading the second data from the second memory module and processing the second data prior to output to the test channel. The operations may include: while the second data is being read from the second memory module or being processed, reading third data from the second memory and storing the third data in the first memory module. The third data may be or include test data. The operations may include: after all or part of the second data has been read from the second memory module, reading the third data from the first memory module and processing the second third prior to output to the test channel.

The system may be or include a test system. The test system may include pin electronics on the test channel. The pin electronics may be configured to receive the first data following processing by the logic circuit, and to output testing data to the DUT that is based on the first data.

The first memory may include a first double data rate dynamic random access memory (DDR RAM) and a second DDR RAM. The second memory may include stacked flash memory. The second memory may include network storage. The processing may include setting timing for the first data and performing at least one of branching, looping, or jumping operations in a script operating on the first data.

The first memory may store expect data. The expect data may represent expected DUT test results. The operations may include receiving test result data for the DUT, reading the expect data from the first memory, comparing the test result data to the expect data to identify whether the DUT has passed or failed testing, and storing, in the first memory, information for the DUT based on the comparing. The information may be stored in a log in the first memory. The operations may include moving at least part of the log from the first memory to the second memory.

One or more non-transitory machine-readable media may store instructions that are executable by one or more processing devices to perform example operations in a system that includes first memory and second memory having a greater areal density than the first memory. The example operations include reading first data from the second memory, storing the first data in the first memory, reading the first data from the first memory, and processing the first data prior to output to a test channel. The test channel leads to a device under test (OUT) to be tested. While the first data is being read from the first memory or being processed:

reading second data from the second memory and storing the second data in available first memory. The first data and the second data may be or include test data.

Any two or more of the features described in this specification, including in this summary section, may be combined to form implementations not specifically described in this specification.

At least part of the systems and techniques described in this specification may be configured or controlled by executing, on one or more processing devices, instructions that are stored on one or more non-transitory machine-readable storage media. At least part of the systems and techniques described in this specification may be configured or controlled using a computing system comprised of one or more processing devices and memory storing instructions that are executable by the one or more processing devices to perform various control operations. The systems and techniques described herein may be configured, for example, through design, construction, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are example implementations of techniques for managing memory in an electronic system, such as a test system. An example technique uses two types of storage: a first type of storage such as a double data rate dynamic random access memory (DDR RAM) and a second type or storage such as flash memory—e.g., non-volatile computer storage. The flash memory has greater areal density than the DDR RAM and is also less expensive for comparable amounts of storage. The flash memory, however, has greater latency than the DDR RAM, particularly for non-serial read/write events. As such, it may be preferable to run test patterns in the test system out of the DDR RAM. However, due to its size and cost, the amount of DDR RAM needed to run test patterns may be impractical. Accordingly, the techniques described herein store test data—such as test vectors for test patterns—in the flash memory and then move that test data to the DDR RAM when needed to run the test patterns.

Figure 1:
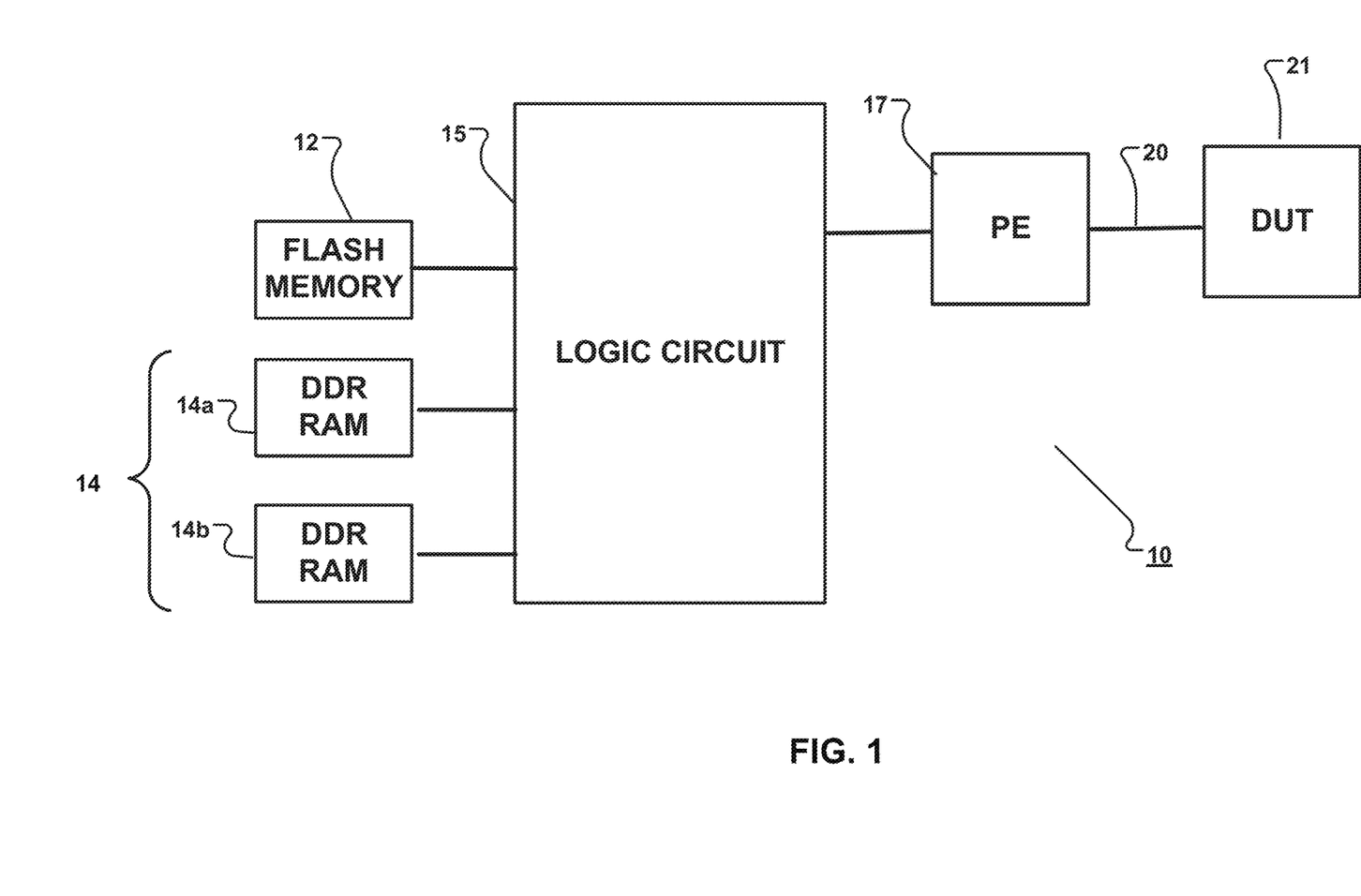
FIG. 1 is a block diagram of components included in an example channel card for a digital test instrument.

In an example, the flash memory includes stacked flash memory that is greater in depth—for example, in some cases more than 100 times greater—than the DDR RAM. A logic circuit, such as an application-specific integrated circuit (ASIC) or field-programmable gate array (FPGA), is configured to move test data from the flash memory to the DDR RAM. This may be done while the logic circuit reads data from the DDR RAM or processes data from the DDR RAM. Thus, the DDR RAM, rather than the flash memory, may be the storage from which the logic circuit runs test patterns. The DDR RAM may also be the storage to which the logic circuit writes test results. The techniques take advantage of the faster operation of the DDR RAM while also using the lower-cost and higher-density/greater capacity flash memory for storage, FIG. 1 is a block diagram of components in an example channel card 10, such as a digital channel card, on which the example memory management techniques described herein may be implemented. In this example, flash memory 12 includes a single memory module (e.g., device); however, flash memory 12 may be implemented using multiple memory modules. In this example, DDR RAM 14 includes two memory modules 14a and 14b (e.g., two memory devices); however, DDR RAM 14 may be implemented using a single memory module as described with respect to FIGS. 3 and 4 or using more than two memory modules. Logic circuit 15 is connected electrically to both flash memory 12 and DDR RAM modules 14a and 14b by way of respective memory ports on the logic circuit, through which data can be read and written.

Logic circuit 15 is configured to read test data, such as test vectors, from DDR RAM 14 and to process the test data to generate test patterns to test a DUT. For example, logic circuit 15 may be configured—for example, programmed—to adjust timing of the test data and to sequence the test data. Logic circuit 15 may also be configured to execute one or more scripts—for example, machine-executable code—to process the test data prior to output. An example script may include one or more of branching, looping, or jumping operations to after the content of the test data for output to the DUT, to alter the format of the test data for output to the DUT, or to after both the content and the format of the test data for output to the DUT.

Logic circuit 15 is also connected electrically to test electronics, such as pin electronics (PE) 17. Among other operations, PE 17 sets voltage levels for test patterns received from the logic circuit, outputs the test patterns over test channel 20 to DUT 21, and receives response data from the DUT. The response data includes, for example, data output by the DUT in response to the test data. The response data may be analyzed to determine whether the DUT passed or failed testing.

DDR RAM 14 also stores "expect data". Expect data includes data that is expected to be produced by the DUT in response to the test data when the DUT is operating correctly. Logic circuit 15 is configured to read the expect data from DDR RAM 14 and to compare the expect data to the response data to determine whether the DUT has passed or failed testing. Logic circuit 15 thus identifies, based on this comparison, whether a DUT has passed or failed testing. The identities of DUTs that have failed testing may be stored in DDR RAM 14. In some implementations, only the identities of DUTs that have failed are stored; however, in some implementations, the identities of DUTs that have passed testing are also stored in DDR RAM 14.

In this example, logic circuit 15 alternatively reads test data from, and stores test data in, the DDR RAM modules 14a and 14b. That is, test data is read from one DDR RAM module while other test data is stored in another DDR RAM module. For example, logic circuit 15 may read test data from DDR RAM module 14b to process for output to the DUT. Concurrently or after reading the test data, logic circuit 15 may read other test data from flash memory 12 and store that other test data in DDR RAM module 14a, After all of the test data has been read from DDRM RAM module 14b, logic circuit 15 may read the test data from DDR RAM module 14a to process to output to the OUT, Concurrently or after reading the test data from DDR RAM module 14a, logic circuit 15 may read still other test data from flash memory 12 and move that other test data to—that is, store the other test data in—DDR RAM module 14b. After all of the test data has been read from DDRM RAM module 14a, logic circuit 15 may read the test data from DDR RAM module 14b to process to output to the DUT. These operations may be repeated alternately such that, effectively, DDR RAM 14 does not run out of usable space. As a result, logic circuit 15 can continue to take advantage of the greater speeds achievable using the DDR RAM while the system takes advantage of the lower-cost, lower-size flash memory for storage of large volumes of test data. In an example, the flash memory may be on the order of one terabyte (TB) or more and each individual DDR RAM module may be on the order of 16 gigabytes or less.

Figure 2:
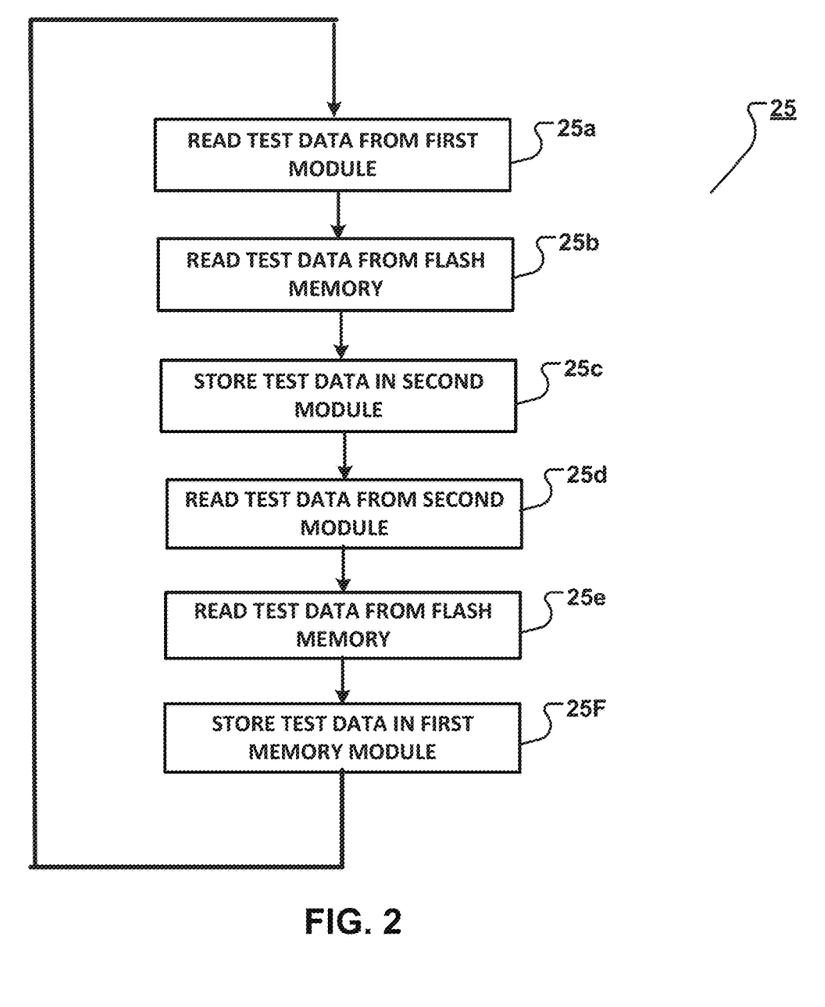
FIG. 2 is a flowchart showing an example memory management process that uses multiple random access memory (RAM) modules.

Referring to FIG. 2, according to example process 25, logic circuit 15 reads (25a) test data from a first DDR RAM module 14b and processes that test data as described above for output to PE 17. Concurrently, or subsequent to reading (25a), logic circuit 15 reads (25b) test data from flash memory 12 and stores (25c) that test data in a second DDR RAM module 14a. When DDR RAM module 14b has been depleted of test data or at a predefined or an appropriate other time, logic circuit 15 reads (25d) test data from DDR RAM module 14a and processes that test data as described above for output to PE 17. Concurrently, or subsequent to reading (25d), logic circuit 15 reads (25e) test data from flash memory 12 and stores (25f) that test data in DDR RAM module 14a. Thereafter, the process repeats. The prior test data that was previously read-out by logic circuit 15 may be overwritten or the newly-read test data may be stored in a different region of each DDR RAM module if a region is available for storage. The test data that the logic circuit stores alternately in the first and second DDR RAM modules may be in sequence such that, when the test data is read out of those DDR RAM modules, it is in the appropriate order for testing. For example, a first set of test vectors may be stored in DDR RAM 14b (or alternatively 14a); a second set of test vectors that follows the first set in sequence may be stored in DDR RAM 14a (or alternatively 14b); and so forth, so that when the test vectors are read out from different memory modules, they are in the appropriate order.

The foregoing process can be repeated, for example, to provide 180 times or more virtual memory depth than is actually present in the memory devices. The extra DDR RAM module may be used to allow more DDR RAM bandwidth and depth to enable background re-loading while sourcing vectors to the logic circuit. Part of the extra DDR RAM space may be allocated as buffer space to hide extra latency associated with fetching from flash memory. Vector definition tables within the logic circuit may be updated with extended memory addresses and depth to define memory modules that are sourced from flash memory as they may have different rules. In some examples, this will allow the logic circuit to use all of the DDR RAM and flash memory flexibly and seamlessly. This memory management technique could be hidden from a user using pattern compiler software algorithms, if necessary Following testing of the DUT, as described previously, the logic circuit 15 stores the identities of DUTs that have failed testing in a log in DDR RAM 14. This data may be stored in one or more logs on either DDR RAM memory module 14a or 14b. At some point—for example, if the log becomes too large given the size of DDR RAM 14 or reaches or exceeds a predetermined size—the logic circuit may move all or part of the log from DDR RAM 14 to flash memory 12 for storage.

Figure 3:
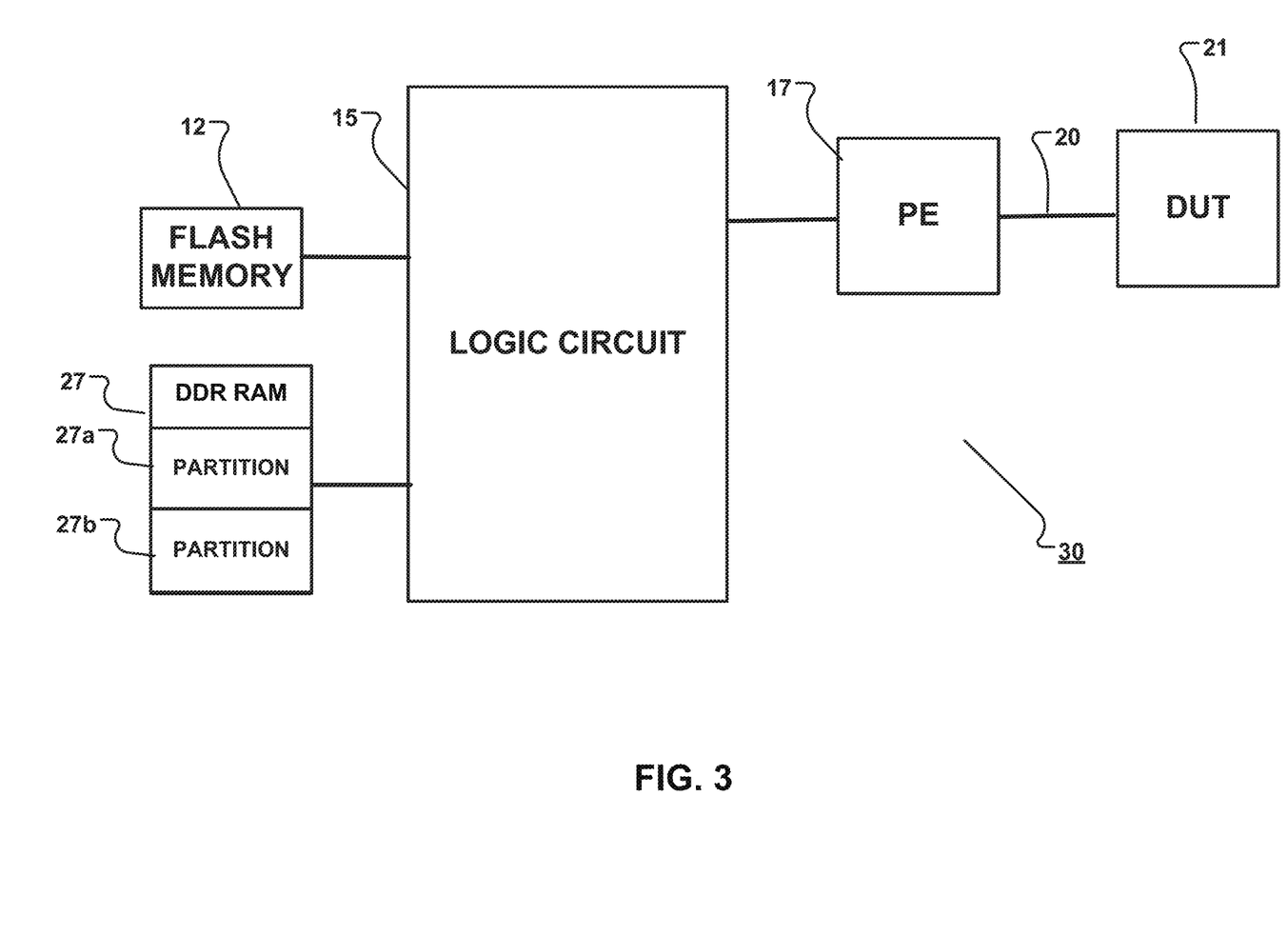
FIG. 3 is a block diagram of components included in an example channel card for a digital test instrument.

Referring to FIG. 3, in another example channel card 30, logic circuit 15 implements an example of the memory management techniques described previously using a single DDR RAM memory module 27 rather than the two shown in FIG. 1. In this example, the structure and function of the other components shown in FIG. 3 are as described with respect to FIG. 1. In this example, single DDR RAM module 27 may include two (or more) partitions 27a and 27b that function as effective separate memory modules. Accordingly, logic circuit 15 alternatively reads test data from, and stores test data in, DDR RAM partitions 27a and 27b. That is, test data is read from one DDR RAM partition while other test data is stored in another DDR RAM partition. For example, logic circuit 15 may read test data from DDR RAM partition 27b to process for output to the DUT. Concurrently or after reading the test data, logic circuit 15 may move other test data from flash memory 12 to DDR RAM partition 27a. After all of the test data has been read from DDRM RAM partition 27b, logic circuit 15 may then read the test data from DDR RAM partition 27a to process to output to the DUT. Concurrently or after reading the test data from DDR RAM partition 27a, logic circuit 15 may move still other test data from flash memory 12 to DDR RAM partition 27b. After all of the test data has been read from DDRM RAM partition 27b, logic circuit 15 may read the test data from DDR RAM partition 27a to process to output to the DUT. This process may be repeated such that, effectively, DDR RAM 27 does not run out of usable space. As above, logic circuit 15 can take advantage of the greater speeds achievable using the DDR RAM while the system takes advantage of the lower-cost, lower-size flash memory for storage of large volumes of test data. In this example, the flash memory may be on the order of one terabyte (TB) or more and DDR RAM module 27 may be on the order of 16 gigabytes or less or 32 gigabytes or less.

Figure 4:
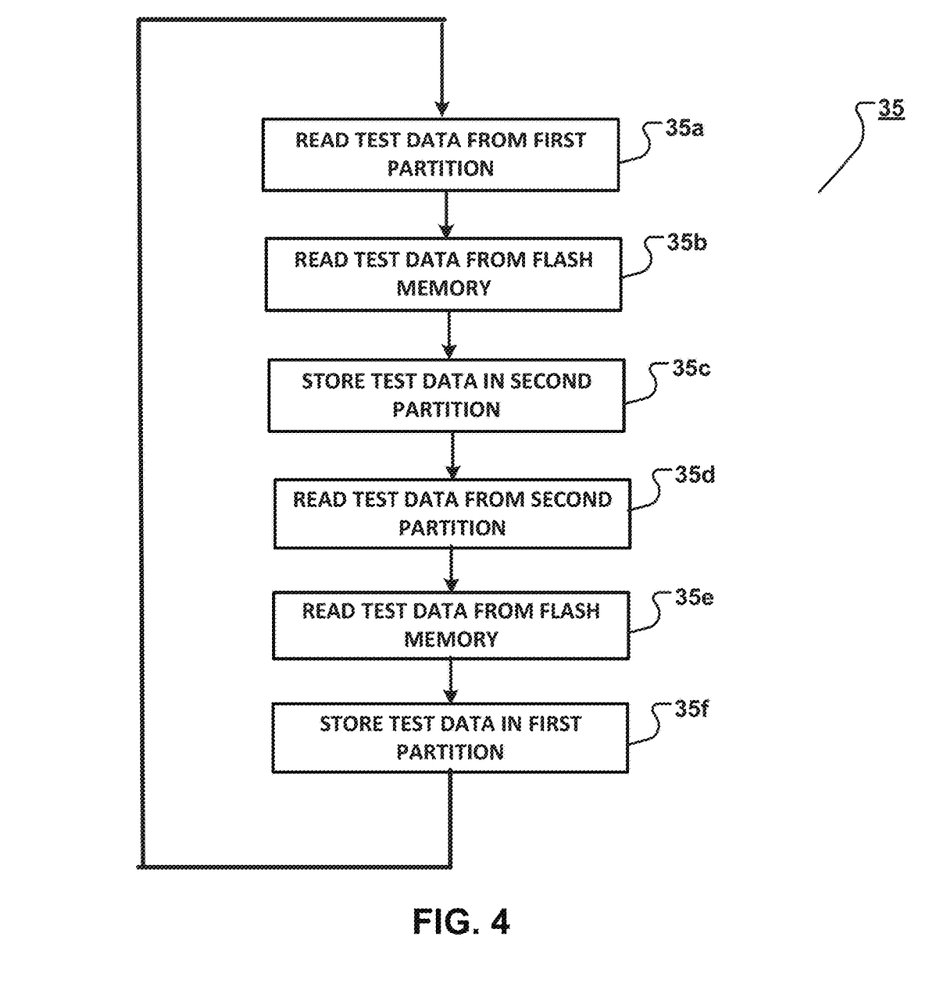
FIG. 4 is a flowchart showing an example memory management process that uses a single RAM module having multiple partitions.

Referring to FIG. 4, according to example process 35, logic circuit 15 reads (35a) test data from a first DDR RAM partition 27b and processes that test data as described above for output to PE 17. Concurrently, or subsequent to reading (35a), logic circuit 15 reads (35b) test data from flash memory 12 and stores (35c) that test data in a second DDR RAM partition 27a. These operations may be repeated alternately. For example, when DDR RAM partition 27b has been depleted of test data or at some other appropriate or predefined time, logic circuit 15 reads (35d) the test data from DDR RAM partition 27a and processes that test data as described above for output to PE 17. Concurrently, or subsequent to reading (35d), logic circuit 15 reads (35e) test data from flash memory 12 and stores (35f) that test data in DDR RAM partition 27b. The operations then repeat, as shown. The prior test data that was previously read-out may be overwritten or the newly-read test data may be stored in a different region of the partition if a region is available for storage. The test data that the logic circuit stores alternately in the first and second DDR RAM partitions may be in sequence such that, when the test data is read out of the DDR RAM partitions 27a and 27b, it is in the appropriate order for testing. For example, a first set of test vectors may be stored in DDR RAM partition 27b (or alternatively 27a); a second set of test vectors that follows the first set may be stored in DDR RAM partition 27a (or alternatively 27b); and so forth, so that when the test vectors are read out alternately from different memory partitions, the test vectors are in the appropriate order.

Following testing of the DUT, as described previously, the logic circuit 15 stores the identities of DUTs that have failed testing in a log in a region of DDR RAM 27, That region may be separate from the partitions where the test data is stored. At some point—for example, if the log becomes too large give the size of DDR RAM 27—the logic circuit may move all or part of the log from DDR RAM 27 to flash memory 12.

The example implementations described herein use DDR RAM and flash memory. However, other appropriate types of memory may be used instead of, or in addition to, these types of memory. For example, network storage may be used in place of flash memory. In this regard, the channel card may be connected either through Ethernet or wirelessly to a computer network that includes the network storage. The network storage may store the test data described herein as being stored in flash memory. The logic circuit may read and write data to the network storage as is described above for the flash memory.

In some implementations, multiple memory modules may be included in a channel card as in the implementation of FIG. 1 and each of those memory modules may be partitioned as in the implementation of FIG. 3. Partitions in individual memory modules may be managed in accordance with process 35 of FIG. 4. Partitions in different memory modules may be managed in accordance with process 25 of FIG. 2.

Figure 5:
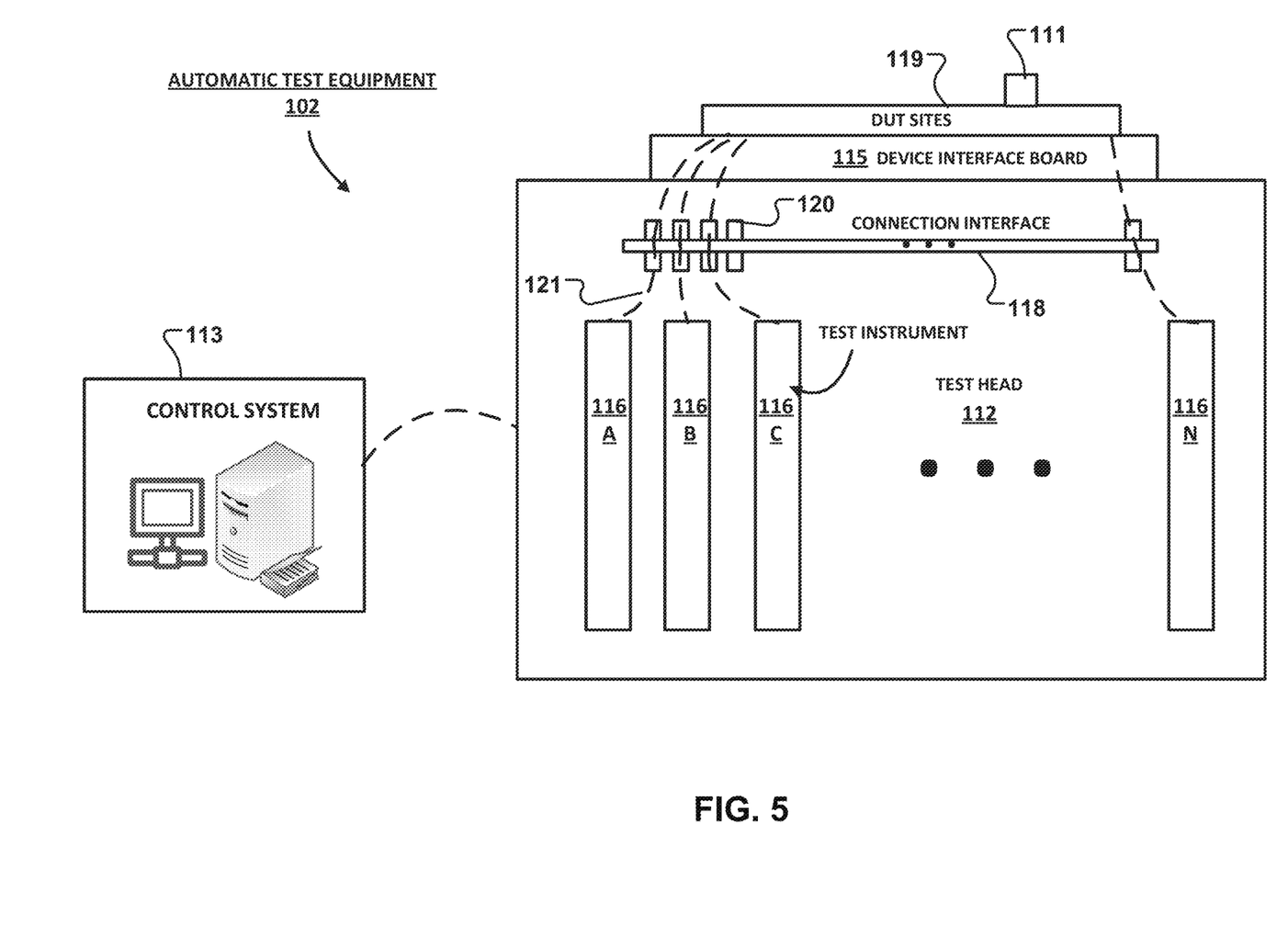
FIG. 5 is a block diagram showing components of an example test system on which the memory management processes described herein may be implemented.

FIG. 5 shows components of example automatic test equipment (ATE) 102 that includes a channel card such as those shown in FIGS. 1 and 3. The channel card may be part of a digital test instrument that may reside in the ATE, as described below.

ATE 102 includes a test head 112 and a control system 113. The control system may include a computing system comprised of one or more microprocessors or other appropriate processing devices as described herein. DIB 115 includes a printed circuit board (PCB) that is connected to test head 112 and that includes mechanical and electrical interfaces to one or more DUTs, such as DUT 111, that are being tested or are to be tested by the ATE. Power, including voltage, may be run via one or more layers in the DIB to DUTs connected to the DIB. DIB 115 also may include one or more ground layers and one or signal layers with connected vias for transmitting signals to the DUTs.

In the example of FIG. 5, DIB 115 connects, electrically and mechanically, to test head 112. The DIB includes sites 119, which may include pins, conductive traces, or other points of electrical and mechanical connection to which the DUTs may connect. Test signals and response signals, such as digital signals, and other types of signals pass via test channels over the sites between the DUTs and test instruments. DIB 115 may also include, among other things, connectors, conductive traces, conductive layers, and circuitry for routing signals between the test instruments, DUTs connected to sites 119, and other circuitry.

Control system 113 communicates with components included in the test head to control testing. For example, control system 113 may download test program sets to test instruments 116A to 116N in the test head. The test instruments include hardware devices that may include one or more processing devices and other circuitry. Test instruments 116A to 116N may run the test program sets to test DUTs in communication with the test instruments. Control system 113 may also send, to test instruments in the test head, instructions, test data, and/or other information that are usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

In an example, a test program generates a test pattern (or flow) to provide to the DUT. The test pattern is written to output test signals to elicit a response from the DUT, for example. As noted, the test signals and the response from the DUT may include digital signals.

In the example of FIG. 5, ATE 102 includes multiple test instruments 116A to 116N, each of which may be configured, as appropriate, to perform one or more of testing and/or other functions. Although only four test instruments are depicted, the system may include any appropriate number of test instruments, including those residing outside of test head 112. In some implementations, a test instrument may be configured to output digital signals to test a DUT based, e.g., on data provided by the control system, and to receive response signals from the DUT. In this regard, test instrument 116A may be a digital test instrument that includes a digital channel card of the type described with respect to FIG. 1 or FIG. 3. Different test instruments may be configured to perform different types of tests and/or be configured to test different DUTs. In some implementations, there may be electrical conductors, such as coaxial wires, between the DUT, the DIB, and the test instrument interfaces over which test and response signals are sent.

Signals, including digital signals, may be sent to, and received from, the DUT over multiple test channels or other electrically conductive media. In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media. A test channel may include and/or electrically connect to a conductive trace on the DIB. A test channel may also include hardware on the test instrument for receiving and digitizing signals.

In some examples, ATE 102 includes a connection interface 118 that connects test instrument test channels 121 to DIB 115. Connection interface 118 may include connectors 120 or other devices for routing signals between the test instruments and DIB 115, For example, the connection interface may include one or more circuit boards or other substrates on which such connectors are mounted. Conductors that are included in the test channels may be routed through the connection interface and the DIB.

Although the implementations described herein are in the context of testing, the memory management techniques described herein may be used outside of a testing context. For example, the memory management techniques described herein may be used in any appropriate electronic system such as computing systems that stored data in memory and output the data for processing.

All or part of the test systems and processes described in this specification and their various modifications may be configured or controlled at least in part by one or more computers such as control system 113 using one or more computer programs tangibly embodied in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system and processes described herein can be performed by one or more programmable processors executing one or more computer programs to control or to perform all or some of the operations described herein. AH or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Machine-readable storage media suitable for embodying computer program instructions and data include all forms of non-volatile storage, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A system comprising:
   first memory;
   second memory having a greater storage capacity than the first memory; and
   a logic circuit configured to move test data from the second memory to the first memory while (i) reading other test data from the first memory, or (ii) both reading the other test data and processing the other test data, the logic circuit being configured to process the other test data prior to output along a test channel, where the test channel leads to a device under test (DUT) to be tested;
   wherein the first memory comprises a first memory module and a second memory module; and
   wherein moving the test data from the second memory to the first memory comprises reading the test data from the second memory and storing the test data, in the first memory module while reading the other test data from the second memory module.

2. The system of claim 1, wherein moving the test data from the second memory to the first memory comprises reading the test data from the second memory and storing the test data in the first memory module while processing the other test data.

3. The system of claim 1, wherein processing the other test data comprises setting timing for the other test data and performing at least one of branching, looping, or jumping operations in a script operating on the other test data.

4. The system of claim 1, wherein the system comprises a test system, the test system further comprising:
   pin electronics along the test channel, the pin electronics being configured to receive the other test data following processing by the logic circuit and to output testing data to the DUT that is based on the other test data.

5. A system comprising:
   first memory;
   second memory having a greater storage capacity than the first memory; and
   a logic circuit configured to move test data from the second memory to the first memory while (i) reading other test data from the first memory, (ii) processing the other test data, or (iii) both reading the other test data and processing the other test data, the logic circuit being configured to process the other test data prior to output along a test channel, where the test channel leads to a device under test (DUT) to be tested;
   wherein the first memory stores expect data, the expect data representing expected DUT test results; and
   wherein the logic circuit is configured to receive test result data associated with the DUT, to read the expect data from the first memory, to compare the test result data to the expect data to identify whether the DUT has passed or failed testing, and to store in memory information for the DUT based on comparing the test result data to the expect data.

6. The system of claim 5, wherein the first memory comprises a first double data rate dynamic random access memory (DDR RAM) and a second DDR RAM.

7. The system of claim 6, wherein the second memory comprises stacked flash memory.

8. The system of claim 6, wherein the second memory comprises network storage.

9. The system of claim 5, wherein the information is stored in a log in the first memory; and
   wherein the logic circuit is configured to move at least part of the log from the first memory to the second memory.

10. A system comprising:
    first memory;
    second memory having a greater areal density than the first memory; and
    a logic circuit configured to perform operations comprising:
      reading first data from the second memory;
      storing the first data in the first memory;
      reading the first data from the first memory;
      processing the first data prior to output to a test channel, where the test channel leads to a device under test (DUT) to be tested; and while reading the first data from the first memory or while processing the first data: (i) reading second data from the second memory, and (ii) storing the second data in available first memory;
wherein the first data and the second data comprise test data;
wherein the first memory comprises a first memory module and a second memory module;
wherein storing the first data in the first memory comprises storing the first data in the first memory module;
wherein reading the first data from the first memory comprises reading the first data from the first memory module; and
wherein storing the second data in available first memory comprises storing the second data in the second memory module, the second memory module comprising the available first memory.

11. The system of claim 10, wherein the operations comprise:
after all or part of the first data has been read from the first memory module, reading the second data from the second memory module and processing the second data prior to output to the test channel.

12. The system of claim 11, wherein the operations comprise:
while the second data is being read from the second memory module or being processed:
reading third data from the second memory; and
storing the third data in the first memory module, the third data comprising test data.

13. The system of claim 12, wherein the operations comprise:
after all or part of the second data has been read from the second memory module, reading the third data from the first memory module and processing the third data prior to output to the test channel.

14. The system of claim 10, wherein the system comprises a test system, the test system further comprising:
pin electronics on the test channel, the pin electronics being configured to receive the first data following processing by the logic circuit, and to output testing data to the DUT that is based on the first data.

15. A system comprising:
first memory;
second memory having a greater areal density than the first memory; and
a logic circuit configured to perform operations comprising:
reading first data from the second memory;
storing the first data in the first memory;
reading the first data from the first memory;
processing the first data prior to output to a test channel, where the test channel leads to a device under test (DUT) to be tested; and
while reading the first data from the first memory or while processing the first data: (i) reading second data from the second memory, and (ii) storing the second data in available first memory;
wherein the first data and the second data comprise test data;
wherein the first memory stores expect data, the expect data representing expected DUT test results; and
wherein the operations further comprise:
receiving test result data for the DUT;
reading the expect data from the first memory;
comparing the test result data to the expect data to identify whether the DUT passed or failed testing; and
storing, in the first memory, information for the DUT based on comparing the test result data to the expect data.

16. The system of claim 15, wherein the first memory comprises a first double data rate dynamic random access memory (DDR RAM) and a second DDR RAM.

17. The system of claim 16, wherein the second memory comprises stacked flash memory.

18. The system of claim 16, wherein the second memory comprises network storage.

19. The system of claim 15, wherein the processing first data comprises setting timing for the first data and performing at least one of branching, looping, or jumping operations in a script operating on the first data.

20. The system of claim 15, wherein the information is stored in a log in the first memory;
wherein the operations further comprise moving at least part of the log from the first memory to the second memory; and
wherein the test data comprises test, vectors or test patterns to send to the DUT to test the DUT.

21. One or more non-transitory machine-readable devices storing instructions that are executable by one or more processing devices to perform operations in a system that comprises first memory and second memory having a greater areal density than the first memory, the operations comprising:
reading first data from the second memory;
storing the first data in the first memory;
reading the first data from the first memory;
processing the first data prior to output to a test channel, where the test channel leads to a device under test (DUT) to be tested; and
while reading the first data read from the first memory or while processing the first data: (i) reading second data from the second memory, and (ii) storing the second data in available first memory;
wherein the first data and the second data comprise test data;
wherein the first memory stores expect data, the expect data representing expected DUT test results; and
wherein the operations further comprise:
receiving test result data for the DUT;
reading the expect data from the first memory;
comparing the test result data to the expect data to identify whether the DUT has passed or failed testing; and
storing, in the first memory, information for the DUT based on comparing the test result data to the expect data.

22. A test system comprising:
first memory;
second memory having a greater storage capacity than the first memory and having a greater latency that the first memory; and
a logic circuit configured to store test data in the second memory and configured to copy at least part of the test data stored in the second memory into the first memory for execution by one or more processing devices, the test data comprising test vectors for testing a device under test (DUT);
wherein the first memory stores expect data, the expect data representing expected DUT test results; and wherein the logic circuit is configured to receive test result data associated with the DUT, to read the expect data from the first memory, to compare the test result data to the expect data to identify whether the DUT has passed or failed testing, and to store in memory information for the DUT based on comparing the test result data to the expect data.

23. The test system of claim 22, wherein the first memory comprises dynamic random access memory and the second memory comprises FLASH memory.

24. The test system of claim 22, wherein the first memory comprises multiple memory modules.

25. The test system of claim 22, wherein the logic circuitry is configured to copy the at least part of the test data stored in the second memory into the first memory based on availability of storage in the first memory.

26. A test system comprising:
   first memory;
   second memory having a greater storage capacity than the first memory and having a greater latency that, the first memory; and
   a logic circuit configured to store test data in the second memory and configured to copy at least a first part of the test data stored in the second memory into the first memory for execution by one or more processing devices, the test data comprising test vectors for testing a device;
   wherein the second memory comprises one terabyte (TB) or more of storage and the first memory comprises 32 gigabytes or less of storage.

* * * * *